(12) United States Patent
Lintonen et al.

(10) Patent No.: US 11,923,805 B2
(45) Date of Patent: Mar. 5, 2024

(54) LOW POWER ELECTRONIC OSCILLATORS

(71) Applicant: Nordic Semiconductor ASA, Trondheim (NO)

(72) Inventors: Mikko Lintonen, Trondheim (NO); Jarmo Väänänen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/784,563

(22) PCT Filed: Dec. 11, 2020

(86) PCT No.: PCT/EP2020/085806
§ 371 (c)(1),
(2) Date: Jun. 10, 2022

(87) PCT Pub. No.: WO2021/116434
PCT Pub. Date: Jun. 17, 2021

(65) Prior Publication Data
US 2023/0010430 A1     Jan. 12, 2023

(30) Foreign Application Priority Data
Dec. 11, 2019 (GB) ........................... 1918211

(51) Int. Cl.
*H03B 5/24* (2006.01)
*H03K 3/014* (2006.01)
(Continued)

(52) U.S. Cl.
CPC .............. *H03B 5/24* (2013.01); *H03K 3/014* (2013.01); *H03K 3/0231* (2013.01); *H03K 4/501* (2013.01);
(Continued)

(58) Field of Classification Search
CPC ...... H03K 3/0231; H03K 4/502; H03K 4/501; H03K 4/50; H03K 3/014; H03B 5/24; H03L 3/00
See application file for complete search history.

(56) References Cited

U.S. PATENT DOCUMENTS 5,617,062 A * 4/1997 O'Shaughnessy ........ H03L 7/02
331/111
7,852,168 B1    12/2010 Song et al.
(Continued)

FOREIGN PATENT DOCUMENTS

KR          20190026275 A *  3/2019 ............. H03K 3/011

OTHER PUBLICATIONS

IPO Search Report under Section 17(5) for GB1918211.2, dated Jan. 29, 2020, 3 pages.
(Continued)

*Primary Examiner* — Ryan Johnson
(74) *Attorney, Agent, or Firm* — Klarquist Sparkman, LLP

(57) ABSTRACT

An oscillator arrangement is provided, comprising a relaxation oscillator having an active state and an inactive state; a bias current circuit portion arranged to provide a bias current to the relaxation oscillator during said active state; and an electronic switch arranged to isolate said relaxation oscillator from the bias current circuit portion when in said inactive state. The oscillator arrangement is arranged to store an internal voltage value associated with said bias current and the bias current circuit portion is arranged to use the stored internal voltage value to generate the bias current when the oscillator is started up from the inactive state to the active state.

9 Claims, 4 Drawing Sheets

(51) Int. Cl.
    *H03K 3/0231*  (2006.01)
    *H03K 4/501*   (2006.01)
    *H03L 3/00*    (2006.01)
(52) U.S. Cl.
    CPC ........ *H03L 3/00* (2013.01); *H03B 2200/0082* (2013.01)

(56) References Cited

U.S. PATENT DOCUMENTS

| | | |
|---|---|---|
| 9,484,893 B1 | 11/2016 | Ruotsalainen et al. |
| 2004/0090281 A1 | 5/2004 | Vilander |
| 2015/0116020 A1 | 4/2015 | Rajaee et al. |
| 2017/0353158 A1 | 12/2017 | Hsu |

OTHER PUBLICATIONS

International Search Report and Written Opinion for PCT/EP2020/085806, dated Mar. 16, 2021, 15 pages.

\* cited by examiner

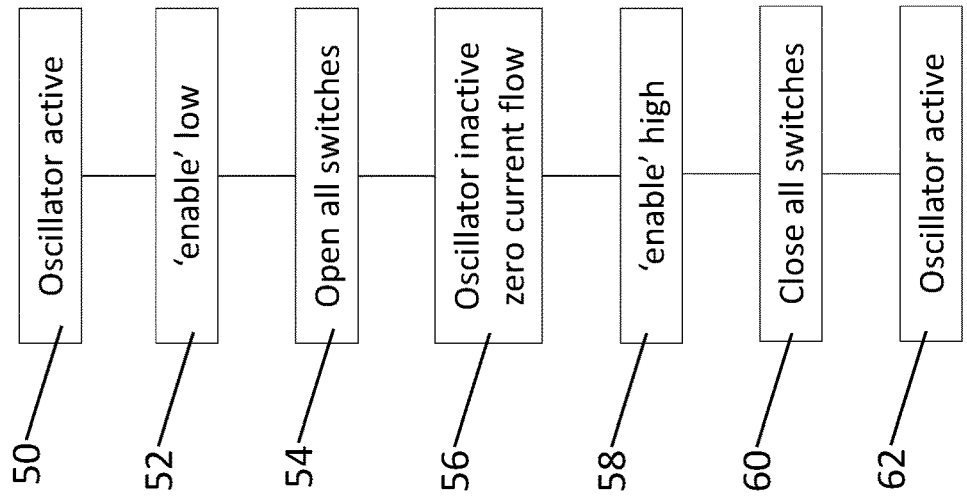
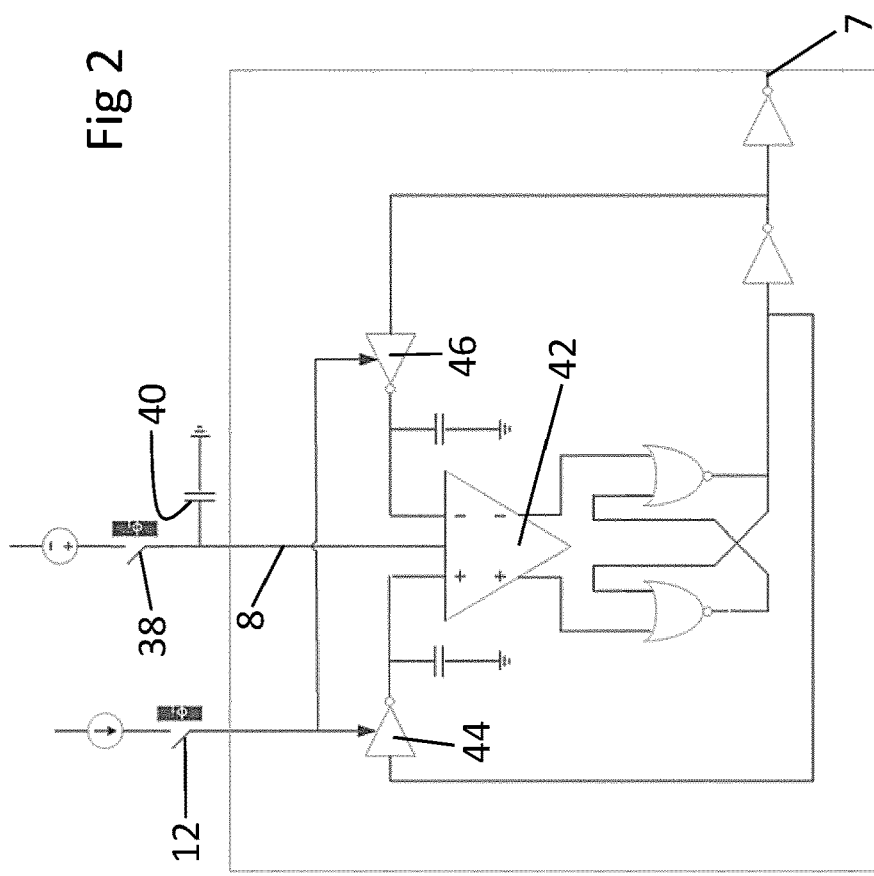

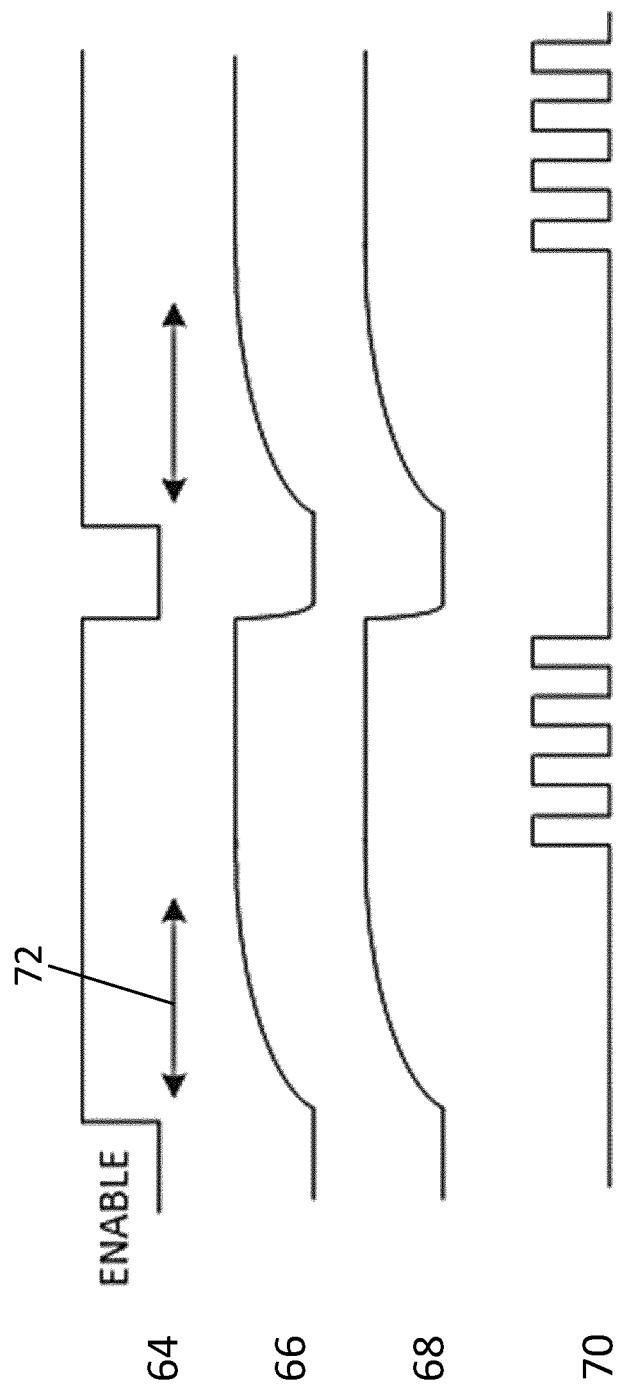

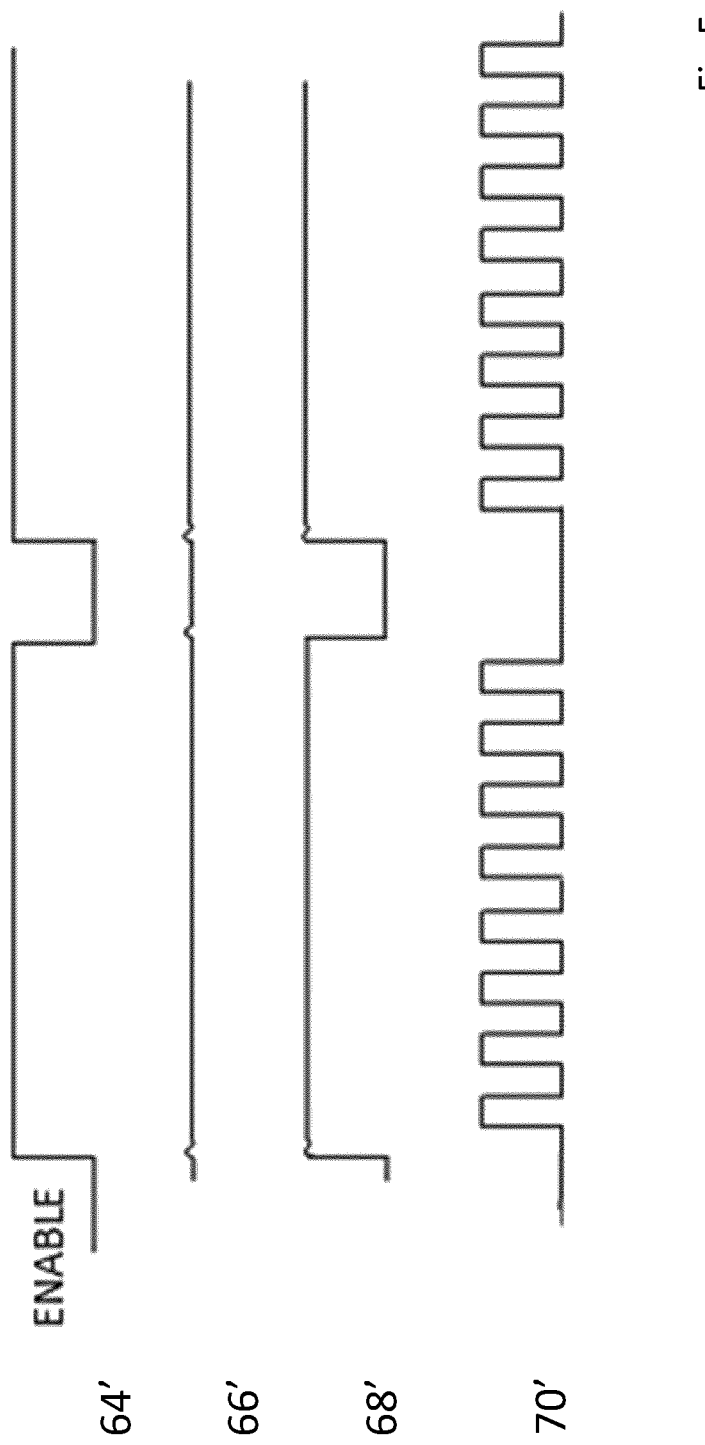

LOW POWER ELECTRONIC OSCILLATORS

CROSS REFERENCE TO RELATED APPLICATIONS

This is the U.S. National Stage of International Application No. PCT/EP2020/085806, filed Dec. 11, 2020, which was published in English under PCT Article 21(2), which in turn claims the benefit of Great Britain Application No. 1918211.2, filed Dec. 11, 2019.

This invention relates to electronic oscillators, particularly but not exclusively for use in low power integrated circuits such as those that include radio transceivers.

Many electronic circuits require a clock source. Whilst for many purposes this would be a high-frequency crystal oscillator, such a high-frequency crystal oscillator draws significant current. For power-sensitive applications it can therefore be desirable additionally or alternatively to use a relatively lower-power, lower-frequency clock source for some timing functions. An example of such a clock source is a relaxation oscillator circuit. In many cases using a fully-integrated relaxation oscillator circuit is preferable to using a crystal as it occupies no chip pins and avoids the need for external components. It is also considerably cheaper than a crystal and can have similarly-low current consumption to a crystal oscillator.

However, although relaxation oscillators can have relatively low power requirements, they still make a significant contribution to current consumption in an integrated circuit. Ideally any clock source should be powered down whenever it is not required but in practice this may not always be practical as relaxation oscillators typically have a significant 'settling time' after they are restarted before they provide an accurate clock signal. This increases the amount of time that they must be powered and may also limit the number of opportunities to power down the clock if it may be needed again shortly.

The present invention seeks to address the issues set out above and when viewed from a first aspect the invention provides an oscillator arrangement comprising:
  a relaxation oscillator having an active state and an inactive state;
  a bias current circuit portion arranged to provide a bias current to the relaxation oscillator during said active state; and
  an electronic switch arranged to isolate said relaxation oscillator from the bias current circuit portion when in said inactive state;
  wherein the oscillator arrangement is arranged to store an internal voltage value associated with said bias current and the bias current circuit portion is arranged to use the stored internal voltage value to generate the bias current when the oscillator is started up from the inactive state to the active state.

The invention extends to a method of operating an oscillator arrangement comprising a relaxation oscillator having an active state and an inactive state, a bias current circuit portion and an electronic switch, said method comprising:
  the bias current circuit portion providing a bias current to the relaxation oscillator during said active state;
  the oscillator changing to said inactive state;
  the electronic switch isolating the relaxation oscillator from the bias current circuit portion;
  storing an internal voltage value associated with said bias current; and
  the bias current circuit portion using the stored internal voltage value to generate the bias current when the oscillator is started up from the inactive state to the active state.

The invention also extends to an integrated circuit comprising the above-mentioned oscillator arrangement.

Thus it will be seen by those skilled in the art that in accordance with the invention the relaxation oscillator can be started up using a bias current which is generated from a value stored by the bias current circuit portion when the relaxation oscillator was previously operating. Such an arrangement may advantageously allow a fast start-up of the relaxation oscillator to provide an accurate clock output signal without the settling time required in conventional arrangements since an accurate bias current can be provided straightaway. This may be the case even though the inactive state draws very little or no current as the oscillator is not operating in this state.

Although other arrangements are envisaged, in a set of embodiments the bias current circuit portion comprises a transistor which passes the bias current. In a set of such embodiments the transistor comprises a field effect transistor (FET) including a gate and the internal voltage value comprises a voltage value at said gate. Preferably the voltage value is stored in a capacitor connected to said gate. The skilled person will appreciate that such a capacitor will provide additional capacitance to the inherent gate capacitance of the transistor. The gate voltage could be stored in a capacitor connected to the fixed voltage (such as ground). Such arrangements may allow rapid re-establishment of the bias current through the transistor when the switch is closed which will allow rapid re-establishment of the correct gate-source voltage.

In a set of embodiments the oscillator arrangement further comprises a reference voltage circuit portion arranged to provide a reference voltage to the relaxation oscillator during said active state. In a set of such embodiments the reference voltage circuit portion is arranged to store a second internal voltage value associated with said reference voltage and to use the stored second internal voltage value to generate the reference voltage when the oscillator is started up from the inactive state to the active state. The second internal voltage value could be the reference voltage itself but this is not essential. In accordance with such embodiments, further improvements in the start-up speed and accuracy of the oscillator can be achieved when starting up from the inactive state as an accurate reference voltage can be provided to the relaxation oscillator straightaway.

In a set of embodiments the reference voltage circuit portion comprises a differential amplifier arranged to control said bias current circuit portion—e.g. by driving the gate of the FET thereof if provided. In a set of such embodiments the differential amplifier is configured to receive at a first input thereof an external voltage reference and at a second input thereof a voltage value derived from the bias current passing through a bias resistor or resistor network.

The electronic switch referred to above helps to reduce current consumption by the oscillator arrangement during the inactive state. In a set of embodiments one or more further electronic switches is/are arranged to stop current flow during said inactive state in one or more of the following places (where provided): between a power supply rail and the relaxation oscillator; between the transistor of the bias current circuit portion and a power supply rail; between the differential amplifier and a power supply rail; between the differential amplifier and the transistor of the bias current circuit portion; between the differential amplifier and a voltage reference source external to the oscillator arrangement; and between a bias current source and the differential amplifier.

The invention may be applied to any suitable relaxation oscillator. The output of the relaxation oscillator may be used to provide a clock signal for any suitable downstream circuit portion such as a charge pump, DC-DC converter or any synchronous digital design requiring a clock which can be stopped for power consumption optimisation. The invention will typically be implemented on a battery-powered integrated circuit but this is not essential.

An embodiment of the invention will now be described, by way of example only, with reference to the accompanying drawings in which:

FIG. 2 is a more detailed schematic circuit diagram of the relaxation oscillator of FIG. 1;

FIG. 3 is a flow diagram describing operation of the circuit of FIG. 1;

FIG. 4 is an output trace of various signals in a typical prior art relaxation oscillator arrangement; and FIG. 5 is an output trace of the same signals in an oscillator arrangement in accordance with the invention.

Figure 1:
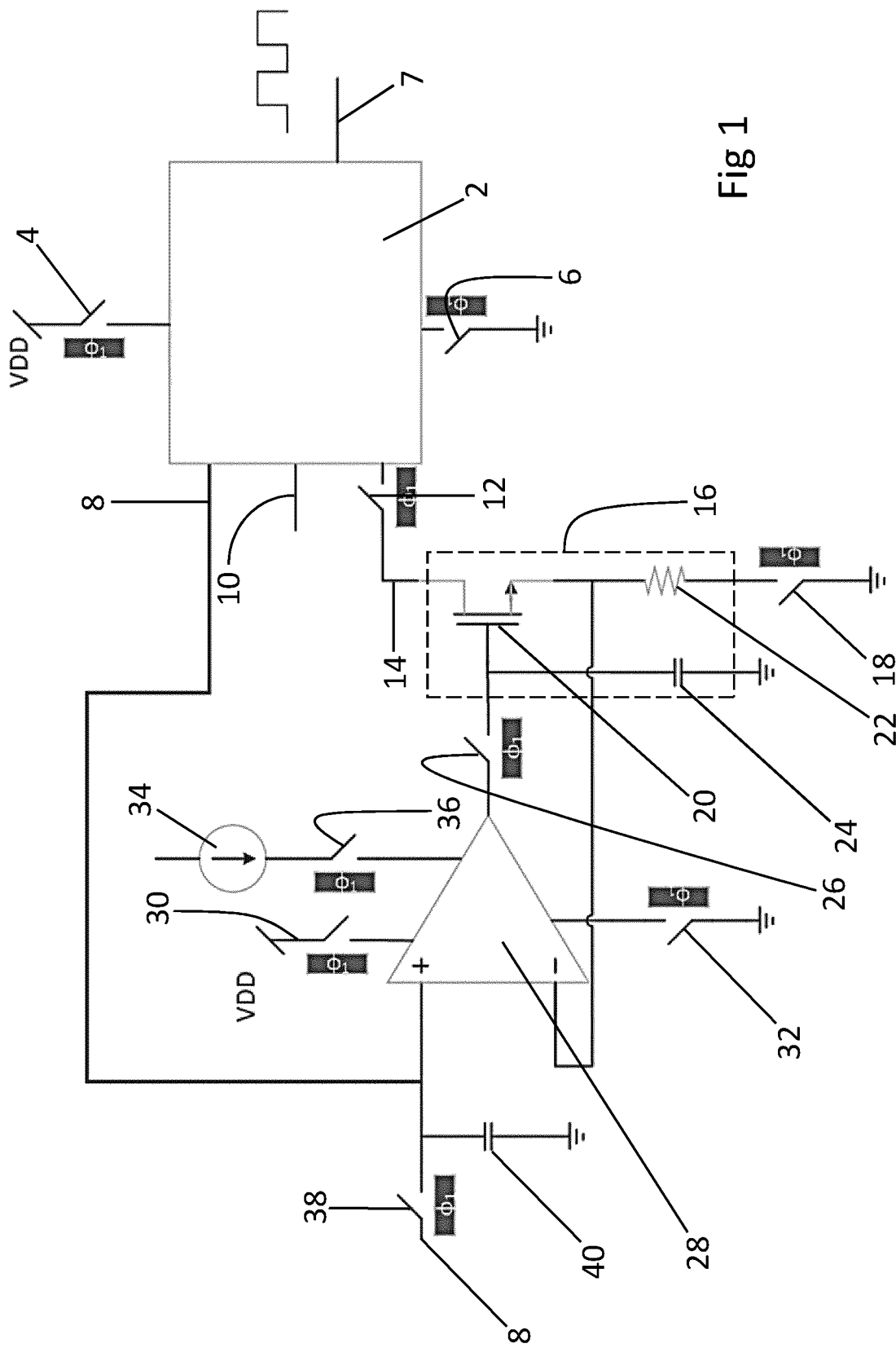
FIG. 1 is a schematic circuit diagram of an oscillator arrangement in accordance with the invention.

FIG. 1 illustrates an oscillator arrangement embodying the invention. This could, for example, be provided as a clock source for a module forming part of a radio transceiver system-on-chip (SoC). At the heart of the arrangement is a relaxation oscillator 2 shown schematically here but shown in more detail in FIG. 2. The oscillator 2 is connected to the positive voltage rail VDD by means of an electronic switch 4 (typically a transistor) and to ground by another electronic switch 6. Although the analogue circuitry inside the oscillator 2 is set in a "floating" mode, the logic gates are grounded. The oscillator 2 provides a clock output 7 which is used by other circuits which require a clock source.

The oscillator 2 has an input 8 for an oscillator reference voltage and another input 10 for an 'enable' signal. This 'enable' signal may come, for example from a central processing unit or a Power and Clock Gate Management System (not shown). Also connected to the oscillator 2 by a further electronic switch 12 is a bias current sink 14 provided by a bias current circuit portion 16 which in turn is connected to ground by another electronic switch 18.

The bias current circuit portion 16 comprises an NMOS transistor 20 with its drain connected to the oscillator 2 and its source connected to a resistor 22 which is connected to the ground isolation switch 18. A capacitor 24 is connected between the gate of the transistor 20 and ground, the purpose of which will be explained later.

The gate of the bias current transistor 20 is also connected, via a further electronic switch 26 to the output of a single-ended differential amplifier 28 — e.g. an operational amplifier. The differential amplifier 28 is connected to VDD and ground respectively by two further electronic switches 30, 32. A very small bias current (of the order of a few nano-Amps) is provided by a current source 34 (which may be external to the oscillator arrangement) via yet another electronic switch 36. The inverting input of the differential amplifier 28 is connected to the source of the bias current transistor 20 and the non-inverting input is connected to the voltage reference input 8 of the oscillator 2. However this is not essential: the operational amplifier positive input sampled voltage and the oscillator sampled reference voltages could be different. In this case an additional switch and capacitor may be provided.

These are connected to an external voltage reference (not shown) via a final electronic switch 38. A second capacitor 40 is provided between the non-inverting input and ground, again the purpose of which will be explained later FIG. 2 shows further details of a typical relaxation oscillator 2 which can be used with the circuit of FIG. 1, although other types can be used. Operation of the relaxation oscillator will be familiar to those skilled in the art and so won't be described in detail here except to note that it is based on a differential comparator 42, the common mode voltage for which is provided by the reference voltage 8. The inverters 44, 46, providing the inputs of the comparator 42 are biased by the bias current 14. Although not shown, the 'enable' signal 10 is used to drive one of the input capacitors on the differential comparator 42 high and one low in order to stop oscillation as described below.

Operation of the circuit of FIG. 1 will now be described with further reference to FIG. 3, beginning at step 50 with the oscillator 2 in its normal active state. In this state, the 'enable' signal is high which means all of the electronic switches 4, 6, 12, 18, 26, 30, 32, 36, 38 are closed. The bias current circuit 16 thus supplies the bias current 14 to the oscillator 2. The differential amplifier 28 drives the bias transistor 20 to set the bias current at a value determined by the reference voltage 8 divided by the value of the bias resistor 22. By providing a stable, accurate bias current and reference voltage to the oscillator 16, the clock output signal from the oscillator will be stable and accurate.

At step 52, when it is desired to power down the oscillator 2, e.g. because the clock signal 7 is temporarily not needed, the 'enable' signal is put low which ceases operation of the oscillator 2 by driving one of the differential comparator input capacitors high and one low. The internal nodes of the differential comparator 42 are allowed to float and its output voltages are forced into such a state that the oscillator output is in a known state. When re-enabled the oscillator will thus continue from this known halt state.

It also opens all of the electronic switches 4, 6, 12, 18, 26, 30, 32, 36, 38 (step 54). This immediately stops any current flowing through the oscillator 2, bias current circuit portion 16, and differential amplifier 28 and so causes the oscillator 2 to enter a fully inactive state and the circuit as a whole to draw no current at all (step 56). However in this state the capacitors 24, 40, remain charged to the voltages they were charged to immediately prior to the oscillator 2 being switched off and thus they act effectively to store the gate voltage of the bias current transistor and the reference voltage respectively. Since the capacitors 24, 40 are fully disconnected and have extremely low self-leakage, these values can be effectively maintained throughout the period in which the oscillator is shut down.

When it is required to restart, the oscillator 2, the 'enable' signal is put high (step 58) and all the switches 4, 6, 12, 18, 26, 30, 32, 36, 38 are closed (step 60). The relaxation oscillator 2 will thus restart. However because the previous gate voltage of the bias current transistor 20 was stored in the capacitor 20 in the bias current circuit portion, the correct level of bias current is effectively instantly restored.

Similarly because the reference voltage was stored in the other capacitor 40, the correct level of the reference voltage is effectively instantly restored. This means that the oscillator 2 can at step 62 go back into its active state and produce a stable and accurate clock signal 7 as soon as it is started up (e.g. within nanoseconds). This contrasts with conventional relaxation oscillators which have a significant start-up delay before the signal they produce is accurate and stable. This is illustrated more clearly in FIGS. 4 and 5.

FIG. 4 shows operation of a typical conventional relaxation oscillator which does not include the capacitors 24, 40 or electronic switches shown in FIG. 1. The top trace 64 shows an 'enable' signal used to switch the oscillator on and off. The next trace 66 shows the voltage reference value. The third trace 68 shows the oscillator bias current and the fourth trace 70 shows the clock output signal. As will be noted when the 'enable' signal 64 goes high, the voltage reference value 66 and the oscillator bias current 68 start to rise but approach their final values only asymptotically as the oscillator settles. This gives rise to a significant delay period 72 after the 'enable' signal 64 goes high during which no clock signal 70 is output because it is not stable.

By contrast, FIG. 5 shows the corresponding traces for an oscillator arrangement in accordance with the invention - e.g. that shown in FIG. 1. As may be seen, as soon as the 'enable' signal 64' goes high, the voltage reference value 66' and the oscillator bias current 68' go straight to their stable values which means that the clock signal 70' can be provided effectively immediately. This enables a saving of power as the oscillator does not need to be powered during a start-up delay. It also makes is feasible to shut down the oscillator for shorter periods of time.

It will be appreciated by those skilled in the art that the foregoing only provides one particular example of how the invention may be implemented and that many variants and modifications are possible within the scope of the invention.

The invention claimed is:

1. An oscillator arrangement comprising:
    a relaxation oscillator having an active state and an inactive state;
    a bias current circuit portion arranged to provide a bias current to the relaxation oscillator during said active state;
    a reference circuit portion arranged to provide a reference voltage to the relaxation oscillator during said active state and
    an electronic switch arranged to isolate said relaxation oscillator from the bias current circuit portion when in said inactive state;
    wherein the oscillator arrangement is arranged to store an internal voltage value associated with said bias current and the bias current circuit portion is arranged to use the stored internal voltage value to generate the bias current when the oscillator is started up from the inactive state to the active state;
    wherein the reference voltage circuit portion comprises a differential amplifier arranged to control said bias current circuit portion.

2. The oscillator arrangement as claimed in claim 1 wherein the bias current circuit portion comprises a transistor which passes the bias current.

3. The oscillator arrangement as claimed in claim 2 wherein the transistor comprises a field effect transistor including a gate and the internal voltage value comprises a voltage value at said gate.

4. The oscillator arrangement as claimed in claim 3 wherein the voltage value is stored in a capacitor connected to said gate.

5. The oscillator arrangement as claimed in claim 1 wherein the reference voltage circuit portion is arranged to store a second internal voltage value associated with said reference voltage and to use the stored second internal voltage value to generate the reference voltage when the oscillator is started up from the inactive state to the active state.

6. The oscillator arrangement as claimed in claim 1 wherein the differential amplifier is configured to receive at a first input thereof an external voltage reference and at a second input thereof a voltage value derived from the bias current passing through a bias resistor or resistor network.

7. The oscillator arrangement as claimed in claim 1, comprising one or more further electronic switches arranged to stop current flow during said inactive state in one or more of the following places: between a power supply rail and the relaxation oscillator; between the transistor of the bias current circuit portion and a power supply rail; between the differential amplifier and a power supply rail; between the differential amplifier and the transistor of the bias current circuit portion; between the differential amplifier and a voltage reference source external to the oscillator arrangement; and between a bias current source and the differential amplifier.

8. An integrated circuit comprising the oscillator arrangement as claimed in claim 1.

9. A method of operating an oscillator arrangement comprising a relaxation oscillator having an active state and an inactive state, a bias current circuit portion, a reference circuit portion comprising a differential amplifier, and an electronic switch, said method comprising:
    providing a bias current with the bias current circuit portion to the relaxation oscillator during said active state;
    providing a reference voltage to the relaxation oscillator with the reference circuit portion during said active state;
    changing the oscillator to said inactive state;
    isolating the relaxation oscillator from the bias current circuit portion using the electronic switch;
    storing an internal voltage value associated with said bias current;
    using the stored internal voltage value to generate the bias current when the oscillator is started up from the inactive state to the active state; and
    controlling the bias current circuit portion with the differential amplifier.

* * * * *